United States Patent
Wang et al.

(10) Patent No.: US 11,600,969 B2
(45) Date of Patent: Mar. 7, 2023

(54) QUANTUM CASCADE LASER ELEMENT

(71) Applicant: RIKEN, Wako (JP)

(72) Inventors: Li Wang, Wako (JP); Hideki Hirayama, Wako (JP)

(73) Assignee: RIKEN, Saitama (JP)

( * ) Notice: Subject to any disclaimer, the term of this patent is extended or adjusted under 35 U.S.C. 154(b) by 125 days.

(21) Appl. No.: 17/221,483

(22) Filed: Apr. 2, 2021

(65) Prior Publication Data

US 2021/0313774 A1 Oct. 7, 2021

(30) Foreign Application Priority Data

Apr. 6, 2020 (JP) ................ JP2020-68706

(51) Int. Cl.
*H01S 5/00* (2006.01)
*H01S 5/34* (2006.01)
(Continued)

(52) U.S. Cl.
CPC .......... *H01S 5/3402* (2013.01); *H01S 5/0213* (2013.01); *H01S 5/2054* (2013.01);
(Continued)

(58) Field of Classification Search
CPC .... H01S 5/3402; H01S 5/0213; H01S 5/2054; H01S 5/3401; H01S 5/34306; H01S 5/34346
See application file for complete search history.

(56) References Cited

U.S. PATENT DOCUMENTS

| | | | |
|---|---|---|---|
| 5,588,015 A * | 12/1996 | Yang .................. | H01S 5/3402 257/97 |
| 2012/0044964 A1 * | 2/2012 | Yang .................. | H01S 5/3401 372/45.01 |

(Continued)

FOREIGN PATENT DOCUMENTS

JP 2016042572 A 3/2016

OTHER PUBLICATIONS

Extended European Search Report, dated Aug. 17, 2021, for European Application No. 21166877.7-1212, 9 pages.
(Continued)

*Primary Examiner* — Kinam Park
(74) *Attorney, Agent, or Firm* — Seed IP Law Group LLP

(57) ABSTRACT

In order to provide a QCL element operating in the near-infrared wavelength range, the present disclosure provides a quantum cascade laser element 1000 having a semiconductor superlattice structure (QCL structure 100) sandwiched between a pair of conductive sections 20 and 30. The semiconductor superlattice structure serves as an active region that emits electromagnetic waves. The active region has a plurality of unit structures 10U that are stacked on top of each other. Each unit structure includes four well layers 10W1-10W4 of a composition of $Al_xGa_{1-x}N$, separated from each other by barrier layers 10B1-10B5 of a composition of $Al_yGa_{1-y}N$ with $0 \le x < y \le 1$. Both of the conductive sections in the pair of conductive sections have a refractive index lower than that of the active region in which doped TCO inserted as a key role.

12 Claims, 10 Drawing Sheets

(51) Int. Cl.
*H01S 5/02* (2006.01)
*H01S 5/20* (2006.01)
*H01S 5/343* (2006.01)

(52) U.S. Cl.
CPC ........ *H01S 5/3401* (2013.01); *H01S 5/34306* (2013.01); *H01S 5/34346* (2013.01)

(56) References Cited

U.S. PATENT DOCUMENTS

| | | | | |
|---|---|---|---|---|
| 2014/0153603 | A1* | 6/2014 | Hirayama | B82Y 20/00 372/45.012 |
| 2015/0117485 | A1* | 4/2015 | Hirayama | H01S 5/3402 372/45.012 |
| 2016/0064901 | A1* | 3/2016 | Terashima | H01S 5/3402 372/4 |
| 2016/0156156 | A1* | 6/2016 | Yang | H01S 5/3211 372/45.01 |

OTHER PUBLICATIONS

Malis et al., "Quantum band engineering of nitride semiconductors for infrared lasers," *Proc. of SPIE*, 9002:8 pages, 2014.

Ishida et al., "Design and Preparation of AlN/GaN Quantum Wells for Quantum Cascade Laser Applications," *Japanese Journal of Applied Physics*, 44(8):5918-5922, 2005.

Ng et al., "Molecular beam epitaxy of $GaN/Al_xGa_{1-x}N$ superlattices for 1.52-4.2 μm intersubband transitions," *Journal of Crystal Growth*, 220:432-438, 2000.

Stattin et al., "ZnO/AlN Clad Waveguides for AlGaN-Based Quantum Cascade Lasers," *Japanese Journal of Applied Physics*, 52:6 pages, 2013.

* cited by examiner

QUANTUM CASCADE LASER ELEMENT

BACKGROUND

Technical Field

The present disclosure relates to a quantum cascade laser (QCL) element. More specifically, the present disclosure relates to a QCL element with a four-well structure for emitting near-infrared light.

Description of the Related Art

Quantum cascade lasers (QCLs) have been attracting attention these days as solid-state light sources that emit electromagnetic waves in the mid-infrared and terahertz (THz) ranges. For example, Patent Document 1 discloses a nitride QCL element in the THz range. QCL elements have a semiconductor superlattice structure with repeating unit structures where the carrier responsible for electrical conduction inside the superlattice is electrons, which are influenced by potential in each layer of the unit structure in addition to bias from external voltage. The potential acting on electrons generally has multiple wells and barriers in each unit structure. The wells and barriers of the potential for electrons are determined by the material of each layer of the unit structure, creating irregularities that reflect the conduction band offset according to position in the thickness, and the overall potential is tilted when an external voltage is applied for operating the QCL element. The carriers, which are electrons, transport through the sub-bands which formed in the tilted and irregular potential, and undergo repeated inter-subband transitions (ISBT). The electrons are coupled with the electromagnetic field at each transition to produce stimulated emission and induce laser oscillation (lasing). Therefore, the semiconductor superlattice structure becomes an active region of the radiative emission. The expression of "cascade" is given to illustrate the behavior of electrons undergoing inter-subband transitions and losing energy during the transport. QCL elements can operate at a wavelength that is independent of the energy band gap of the material. The lasing wavelength or its frequency can be changed just by the semiconductor superlattice structure design. For this reason, QCL elements have attracted attention as unipolar semiconductor lasers for coherent light sources in wavelength ranges (frequency ranges) where solid-state light sources have never been able to operate yet. QCLs in the mid-infrared and far-infrared have been commercialized to date.

Compared to communication systems based on electrical cables, optical fibers demonstrate a number of advantages, the most important of which include their enormous capacity for data transfer, their low optical transmission losses, and their significantly lower cost. The feasible long-distance window of optical communication (1.3 µm and 1.55 µm) is in the near-infrared wavelength range. It is necessary to develop such light sources that are compact, with tunable wavelengths, narrow emission peaks, and high output power capability and are suitable for actual use. Quantum cascade lasers (QCLs) have been regarded as the most promising candidates to meet these requirements.

CITATION LIST

Patent Document

Patent Document 1: JP 2016-042572

BRIEF SUMMARY

Technical Problem

However, lasing operation of QCLs in the near-infrared wavelength range has never been achieved yet. The primary difficulty of near-infrared QCL elements lies in the fact that their very large photon energy necessitates large offsets of the conduction band when designing the active region. For example, the conduction band offset must be above 1 eV.

Such a large offset in the conduction band can be realized in GaN/AlGaN-based materials. Pioneering contributions to ISBTs in GaN have been made in both physics and experiments, and ultrafast carrier dynamics have been confirmed. However, it has not been shown what kind of structures can realize practical QCL elements in the near-infrared range.

The present disclosure is to solve at least some of the above problems and to provide a practical QCL structure that can be used for lasing in the near-infrared wavelength range.

Solution to Problem

The inventor has found a highly practical structure for QCL elements that use GaN/AlGaN-based materials, where the barrier height can be easily adjusted and the wavelength range can be extended. That is, in certain aspects of the present disclosure provided is a quantum cascade laser element comprising a semiconductor superlattice structure sandwiched between a pair of conductive sections, wherein the semiconductor superlattice structure is an active region that emits electromagnetic waves of a certain wavelength in the near-infrared range under an external voltage applied through the pair of conductive sections during operation, the active region has a plurality of unit structures that are stacked, each unit structure consists of four well layers of a composition of $Al_xGa_{1-x}N$ separated from each other by a barrier layer of a composition of $Al_yGa_{1-y}N$ with $0 \leq x < y \leq 1$, with one of the well layers being a maximum thickness well layer that is thicker than the others, and both conductive section in the pair of conductive sections have a refractive index lower than a refractive index of the active region for electromagnetic waves of the wavelength.

In this application, an electromagnetic wave in the near-infrared range refers to an electromagnetic wave in the frequency range of around 30 THz to 380 THz, i.e., a wavelength range of about 0.78 µm to 10 µm. In addition, the description of this application may use terminology diverted or loaned from the field of electronic devices and physics that cover visible and infrared light when describing device structures and functions. Accordingly, even in descriptions of electromagnetic waves in the wavelength or frequency range that cannot be considered as visible light, the terms "laser" and "emission" are used to describe the phenomena in quantum cascade laser elements and induced emission. In addition, terms such as "light", "optical-" and "photo-" may be used. Light confinement and refraction are also a few of the examples. Wavelength is also subject to the convention of using vacuum values even inside of a material.

Advantageous Effects of Disclosure

In any of the present disclosures, there is provided a practical QCL element that can emit light in the near-infrared.

DETAILED DESCRIPTION

Figure 1:
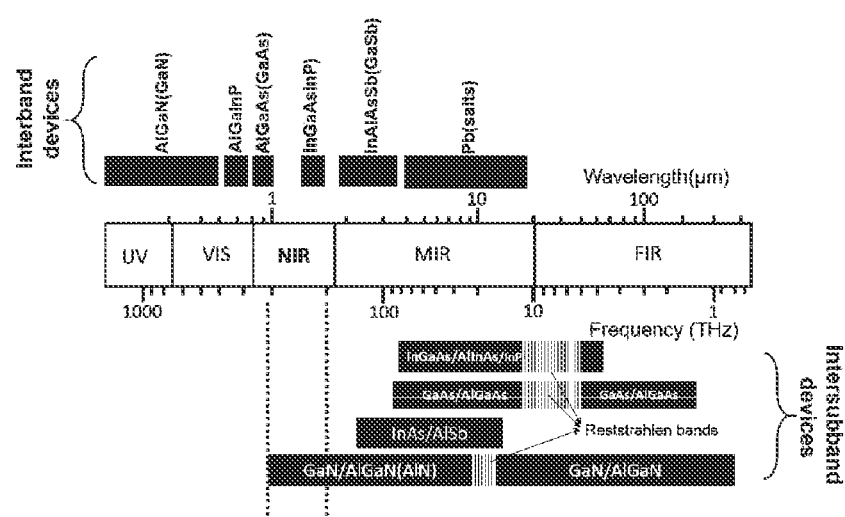
FIG. 1 illustrates the relationship between the material system that makes up the active region and the emission wavelength range in a conventional laser diode device that uses interband transitions for the wavelength range and a QCL element that employs cascade operation, or inter-subband transitions (ISBT), comprising a QCL element based on the GaN/AlGaN material of the present disclosure.

Embodiments of the QCL element of the present disclosure will be described by referring to the following drawings. Throughout the drawings, common parts or elements are denoted by common reference numerals in this description, unless otherwise noted. In addition, each element of each embodiment in the drawing should be understood as not being drawn to scale.

1-1. Conception

In QCL elements provided in the present embodiment, lasing operation in the near-infrared wavelength range is accomplished. What is provided in this embodiment is a practical design of an active region (optical gain region) and an index guide structure to realize the emission. In other words, the present disclosure provides, first, a design of the active region containing only four wells, which is the minimum number of wells used in the near-infrared. In that design, the diagonal LO phonons assist the electron injection into the upper lasing levels and enhance the injection efficiency. Second, an appropriate index guide structure is provided for the growth direction. Typically, a layer of n-type oxide conductor, i.e., ZnO or ITO, is used so that the refractive index is adjusted for the index guide structure while ensuring the smooth electron injection behavior into the active region of the cascade structure. The oxide conductors are also referred to as transparent conductive oxides (TCO).

FIG. 1 illustrates the relationship between the material system that makes up the active region and the emission wavelength range in a conventional laser diode device that uses interband transitions for the wavelength range and a QCL element that employs cascade operation, or inter-subband transitions (ISBT), comprising a QCL element based on the GaN/AlGaN material of the present disclosure. For light sources that utilize the emission of recombination by interband transitions, the emission wavelengths corresponding to the respective band gaps for systems of AlGaN (GaN), AlGaInP, AlGaAs (GaAs), InGaAs (InP), InAlAsSb (GaP), and Pb (salt) materials can be obtained. However, as long as interband transitions are utilized, it is difficult to achieve highly efficient light emission operation in the near- to mid-infrared wavelength range. In contrast, QCL devices using inter-subband transitions are not constrained by the band gap. In QCL elements, research has been conducted mainly on GaAs/AlGaAs materials and InGaAs/AlInAs/InP materials, where crystal growth technology has long been improved. These materials are expected to operate in the longer wavelength range where cascade operation can be realized, i.e., mid-infrared to THz waves (wavelengths of 2 μm to 200 μm and frequencies of 1.5 THz to 150 THz). With regard to the relationship between the material and wavelength range in the case of QCL devices, sufficient optical gain for laser oscillation cannot be obtained in a region called the reststrahlen band for each material system. It is possible to achieve lasing on the longer wavelength side and the shorter wavelength side across this region.

GaN/AlGaN-based materials, in which the conduction band offset, or barrier height, can be easily enlarged by adjusting the mixed crystal composition ratio, have not been sufficiently investigated for QCL elements and promising designs have not been proposed because of the technical difficulty in crystal growth compared to GaAs-based materials. Aiming at a practical design that can be expected to achieve lasing operation in the near-infrared wavelength range, which is difficult to achieve with interband transitions and cannot be achieved with QCL elements based on ISBT in other materials, the inventors have succeeded in creating a highly practical structure for QCL devices using GaN/AlGaN-based materials, where the barrier height can be easily adjusted and the wavelength range can be easily increased.

1-2. Configuration of QCL Element in the Embodiment

Figure 2A:
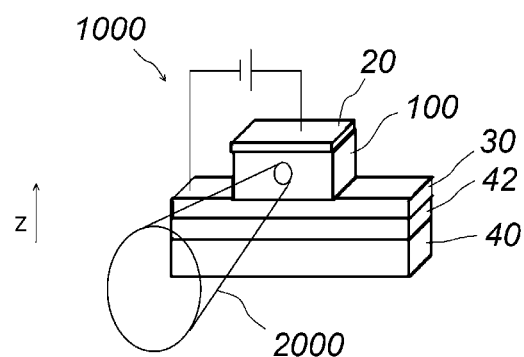
FIGS. 2A-2C illustrate a diagram (FIG. 2A), an enlarged cross-sectional view (FIG. 2B), and a further partially enlarged cross-sectional view (FIG. 2C) showing an overview of the configuration of a QCL element in an embodiment of the present disclosure.
Figure 2B:
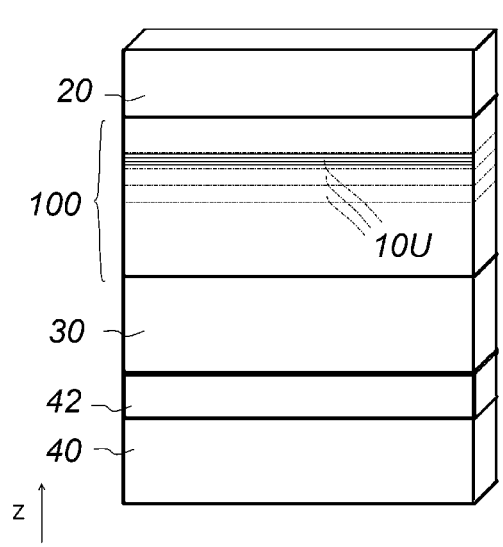
Figure 2C:
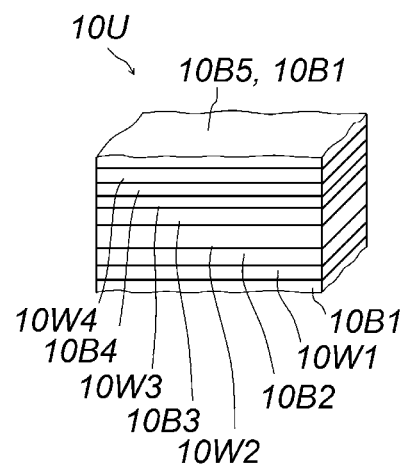

FIGS. 2A-2C illustrate a diagram (FIG. 2A), an enlarged cross-sectional view (FIG. 2B), and a further partially enlarged cross-sectional view (FIG. 2C) showing an overview of the configuration of a QCL element of this embodiment. The QCL element 1000 (FIG. 2A) of this embodiment is generally comprised of a pair of conductive sections 20 and 30 and a QCL structure 100, which is a semiconductor superlattice structure sandwiched between the two conductive sections.

The conductive sections 20 and 30 are used to receive a voltage to produce an electric field to the QCL structure 100 and a current to emit electromagnetic waves, i.e., optical emission, from an external source. In typical cases, the conductive section 20 is made of an oxide conductor being doped to be n-type, and the conductive section 30 is made of an $Al_zGa_{1-z}N$ ($0.4 \le z \le 0.6$) layer being doped to be n-type. The QCL element 1000 is configured to form a waveguide structure for electromagnetic waves in the near-infrared range. In the waveguide structure, the QCL structure 100 is a core in which light is confined, and the conductive parts 20 and 30 are index guides (cladding) for the confinement. When the QCL element 1000 is in operation, a potential structure that is carefully designed for electrons is shaped within the QCL structure 100 as a result of the application of the above voltage. In order for this potential structure to have a suitable and repetitive structure, the QCL structure 100 (FIGS. 2B and 2C) has a plurality of unit structures 10U of a certain thickness that contain alternatingly stacked well layers 10W1 to 10W4 and barrier layers 10B1 to 10B5, one or more of which are repeatedly formed. Electrons passing along the thickness direction of the unit structure 10U emit electromagnetic waves 2000 as the electrons make transitions between multiple confinement levels (between multiple sub-bands), which are typically formed in the well 10W of the potential as they pass through the structure of the potential. As shown in FIG. 2 the z-direction is defined in this application as the thickness direction from the conductive portion 30 to the conductive portion 20, unless otherwise noted. The well layers 10W1 to 10W4 and the barrier layers 10B1 to 10B5 may be collectively referred to as the well layer 10W and the barrier layer 10B, respectively.

The QCL structure 100 (FIG. 2A) of the QCL element 1000 is a multi-layered stacking structure on a sapphire substrate 40 in the overall device and is formed by trimming off the outsize shape of the spread of layers of the QCL structure 100 (FIG. 2B). A typical QCL element 1000 in this embodiment is formed by epitaxial growth using polar faces, for example, on a sapphire substrate 40 with a (0001) surface orientation. To describe this typical example in detail, an AlN layer 42, which serves as a buffer layer, is formed on the surface of the sapphire substrate 40 to a thickness of 1000 nm, a highly doped n-type Al0.5Ga0.5N (typical electron density of about $5 \times 10^{18}$ cm$^{-3}$) is formed in contact with the surface of the AlN layer 42 to a thickness of 2000 nm as the conductive part 30. After that, the QCL structure 100, which serves as an active region, is formed. This composition of the conducting part 30 is a typical example of an $Al_zGa_{1-z}N$ ($0.4 \le z \le 0.6$) layer; the detailed structure of the QCL structure 100 will be described later. On the top surface of the fabricated QCL structure 100, an n-type doped TCO layer is formed to a thickness of 400 nm for the conductive portion 20. A typical material of the TCO layer is indium tin oxide (ITO), with a typical electron density of about $5 \times 10^{19}$ cm$^{-3}$.

In the QCL structure 100 shown in FIG. 2B, unit structures 10U of the same structure are generally stacked, repeatedly one after the other, for 10 to 200 periods to build up the active region having 40 layers positioned one above the other, for example. FIG. 2C shows an enlarged view of the structure of one unit (also referred to as one period) of each unit structure 10U. In the unit structure 10U, the barrier layer 10B and the well layer 10W are alternatingly stacked. The well layer 10W1 is placed in contact with the barrier layer 10B1, the barrier layer 10B2 is placed in contact with the well layer 10W1, and so on. The barrier layer 10B5 serves as the barrier layer 10B1 for the unit structure 10U in the next period. Each of the unit structures 10U is stacked one after the other in repeated depositions along the thickness direction. Each unit structure 10U has four well layers 10W, well layers 10W1 through 10W4, in this order from the side of the conductive portion 30. Each well layer 10W is partitioned from each other by a barrier layer 10B. The individual barrier layers 10B are also distinguished as necessary and are referred to as barrier layers 10B1 to 10B5 in this order from the side of the conductive portion 30. Each unit structure 10U has a four-quantum-well structure consisting of well layers 10W1 to 10W4 with a composition of $Al_xGa_{1-x}N$, separated from each other by a barrier layer with a composition of $Al_yGa_{1-y}N$ as $0 \le x < y \le 1$. The well layers 10W1 to 10W4 are typically GaN layers. The x and y are the ratios of AlN in the mixed crystal of GaN and AlN, respectively. The larger the value of y-x, the larger the conduction band offset and the deeper the potential well in the well layer 10W. The well layer 10W2 is thicker than the well layers 10W1, 10W3, and 10W4. One or more of the well layers 10W1 through 10W4 are made n-type by doping, typically the well layers 10W1 and 10W4 are doped. The doping here is carried out by modulated doping during the formation of the well layers 10W1 and 10W4 so that the electron density of the well layer 10W1 is, for example, about $2 \times 10^{18}$ cm$^{-3}$. In this way, a unit structure 10U is fabricated with a structure such that the four well layers 10W1 to W4 are partitioned from each other by a barrier layer. In the following, the description of the well layers 10W1-10W4 will be based on the GaN layer with x=0, unless otherwise noted, which is only a typical example of the description for the case of the composition of $Al_xGa_{1-x}N$ for the well layers 10W1-10W4.

Details of the typical design example described above, including the size of each layer, are shown in Table 1. The values of the design examples in Table 1 are of a specific design that provides high gain at a wavelength of 1.55 μm, the details of which will be described later.

TABLE 1

| | Layer | n-doped (cm$^{-3}$) | Thickness (nm) |
|---|---|---|---|
| | Sapphire | — | (350 μm) |
| | AlN buffer | — | 1000 |
| Index Guide/Contact Layer | $Al_{0.5}Ga_{0.5}N$ | [Si] n-type $5 \times 10^{18}$ | 2000 |
| (40 periods repetition) | $Al_{0.8}Ga_{0.2}N$ | — | 0.85 |
| | GaN | $1 \times 10^{18}$ | 0.9 |
| | $Al_{0.8}Ga_{0.2}N$ | — | 0.7 |
| | GaN | — | 2.2 |
| | $Al_{0.8}Ga_{0.2}N$ | — | 0.8 |
| | GaN | — | 1.3 |
| | $Al_{0.8}Ga_{0.2}N$ | — | 0.8 |
| | GaN | $1 \times 10^{18}$ | 1.0 |
| Index Guide/Contact layer | TCO | $5 \times 10^{19}$ | 400 |
| Metal Contact | Ti/Al/Ni/Au | — | 500 |

(Bold text lines denote the active area of the maximum width GaN well)

The design of the QCL element 1000 is conducted on theoretical calculations. The method employed is the non-equilibrium Green's function method, and the self-consistent method is employed when determining the wave function. In the calculation, what is considered are the effects of scattering due to interfacial roughness, electron-LO phonon interaction, electron-charged impurities, electron-electron interaction, and through-dislocations on the gain.

Figure 3:
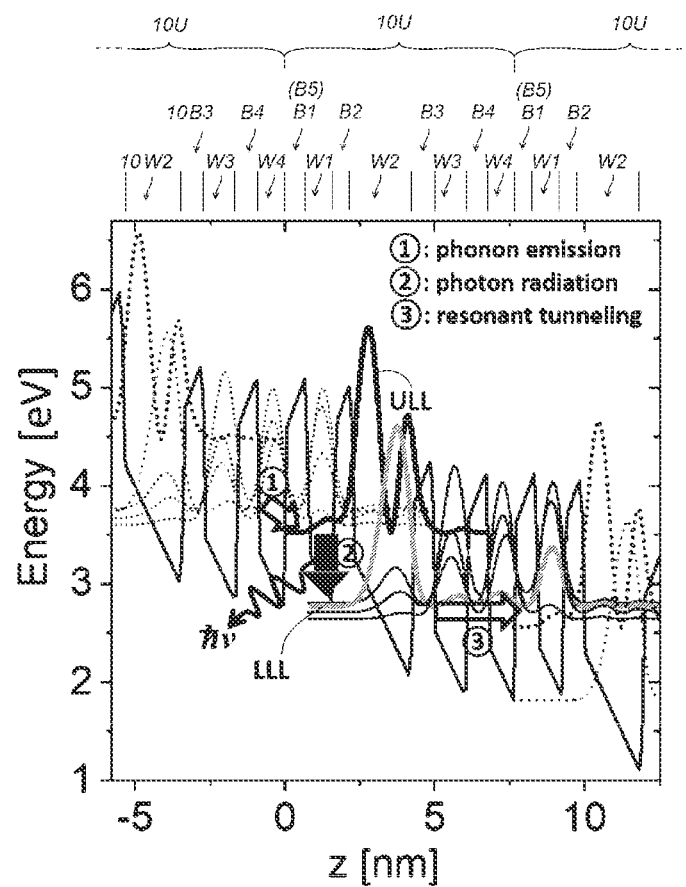
FIG. 3 is a graph showing a typical example of a conduction band diagram, which is a calculated potential for conduction band electrons, and an existence probability distribution of electrons versus position in the thickness direction in the operational state for an example design of a QCL element in an embodiment of the present disclosure.

FIG. 3 shows a typical example of the potential (conduction band diagram) and distribution of probability of existence of electrons for conduction band electrons calculated for the cascade structure within three neighboring periods in the QCL element 1000 of this embodiment. As presented in Table 1, the QCL element 1000 has a QCL structure 100 with four wells, and a GaN layer is employed for the well layers 10W1-10W4, and an Al0.8Ga0.2N layer is employed for the barrier layers 10B1-10B5 in its typical design example. In FIG. 3, the thickness direction is taken as the abscissa, the potential for electrons is drawn under operation with a bias voltage applied, and the existence probability (existence probability distribution) at each position of the confinement level in thickness direction determined by the wavefunction is plotted there. The thickness direction confinement level is a level formed according to the potential of the well layer to have a discrete energy as described by quantum mechanics, and the wavefunction of that level can also penetrate into the barrier layer to some extent. The vertical position of the baseline (not shown) for each existence probability distribution is adjusted to the energy value of the level. In the upper margin of the graph, the positions and ranges of the well layers 10W1-10W4, the barrier layers 10B1-10B5, and the unit structure 10U are indicated, where the well layer 10W1 is abbreviated to W1, etc. As shown in Table 1, the thicknesses (potential widths) of the barrier layer and well layer in one period of the unit structure 10U are 0.85/0.9/0.7/2.2/0.8/1.3/0.8/1 nm in order from the side of the conductive section 30. In this design example, the operating bias is set to 980 mV/period. The upper lasing level (ULL) and the lower lasing level (LLL) are the ground state and the first excited state of the maximum width GaN well, i.e., the two layer thickness confinement levels in the well layer 10W2. In one typical design example, the energy separation and dipole matrix elements between the upper and lower lasing levels in the QCL element 1000 are 970 meV and 0.42 nm, respectively.

This design example demonstrates that, within the operating bias (980 mV/period), photons can be emitted as electrons relax from the upper lasing level to the lower lasing level subsequent to an intra-subband transition. Initially, electron injection from the ground state in the upstream nearest neighbor well to the upper lasing level is achieved by diagonal emission of a single LO phonon. This process is also advantageous for thermal relaxation and has the effect of cooling the electron temperature throughout a period of cascade. After the emission of photons between the upper and lower lasing levels, electrons are depopulated from the lower lasing level by sequential resonant tunneling, and then injected into the next period, and so on.

Based on the explanation so far, the idea that led to the design of the specific structure of the QCL structure 100 will be explained. In FIG. 3, a GaN well with the largest width is the well layer 10W2 and is the well of the largest thickness, whose thickness is selected within a range in which only two lasing levels, the lower lasing level and the upper lasing level, can become confinement levels in thickness direction. Generally, the thicker the well layer is, the more levels can become confinement levels in thickness direction; in this case, however, the thickness is determined so that at most two confinement levels are accommodated in the GaN well of the maximum width (well layer 10W2). This embodiment is an example of designing the well layer 10W and the barrier layer 10B to have at most two confinement levels in thickness direction by suitably selecting the material and thicknesses of the well layers 10W and the barrier layers 10B, even if the energy difference between the upper and lower lasing levels is large enough to match the near-infrared wavelength range.

The transport of electrons before and after optical transitions has also been designed to achieve an inverted distribution. Specifically, among the well layers 10W3, 10W4, and 10W1, the confinement level in thickness direction of the nearest neighboring well layer 10W1 becomes the injection level that injects electrons into the upper lasing level by phonon-mediated phonon-electron scattering. This injection level is also the ground state for the well layer 10W1. The confinement level in thickness direction of one of the well layers 10W3, 10W4, or 10W1, which is consecutively located downstream as viewed from well layer 10W2 in terms of the electron stream, becomes the extraction level that extracts electrons from the lower lasing level by resonant tunneling. A plurality of confinement levels in thickness direction are formed in the well layers 10W3, 10W4, and 10W1, which are located consecutively downstream in the electron stream. These multiple thickness direction confinement levels operate to transport electrons through the confinement levels in thickness direction by extracting electrons from the lower lasing levels, allowing immediate resonant tunneling.

In the design that achieves such operation, the thicknesses of well layers 10W3, 10W4, and 10W1, each, with the exception of well layer 10W2 (the widest well), are progressively increasing or decreasing in the order of stacking within a range sandwiched between two maximum thickness well layers belonging to two consecutive unit structures 10U. For example, in the design shown in FIG. 3, the thicknesses of the well layers 10W3, 10W4, and 10W1 are progressively decreasing in the order: 1.3, 1.0, and 0.9 nm. If we include the well with the largest width, we can say that the values of the thickness of the four well layers are progressively increasing or decreasing. The progressive increase or decrease can be within a single unit structure or across two consecutive unit structures. This is because the definition of the unit structure is a matter of choice so long as it denotes a unit of repetition, and because it is a matter of choice that which well layers are included in the unit structure.

In this design, the energy value of the confinement level in the film thickness direction is adjusted to be suitable for the transport of electrons for injection into the ULL by phonon-electron scattering and for extraction from the LLL by successive resonant tunneling. At this time, the potential values of the well layer are ramped due to the polarization of the material. For example, as shown in FIG. 3, the potential of each well layer, i.e., the bottom of the well, is inclined to the right, the same as the overall rightward inclination. Because of this slope of the potential, the relative position of the potential values (in the vertical direction in FIG. 3) of each well layer can be adjusted by changing the thickness of each well layer. In other words, by progressively increasing or decreasing the thickness of each well layer, the energy values of the multiple confinement levels in thickness direction can be adjusted to each other in accordance with the overall slope of the potential at the bias voltage. It is possible to design the energy values of the confinement levels in thickness direction. Whether to progressively increase or decrease the thickness of the well layers can be determined according to the polarity of the polarization of each layer and the polarity and value of the bias voltage. It should be noted that the design of the energy values of the confinement levels in thickness direction using the potential slope and thickness can also be achieved by progressively increasing or decreasing the thickness of the barrier layer rather than the well layers.

Figure 4:
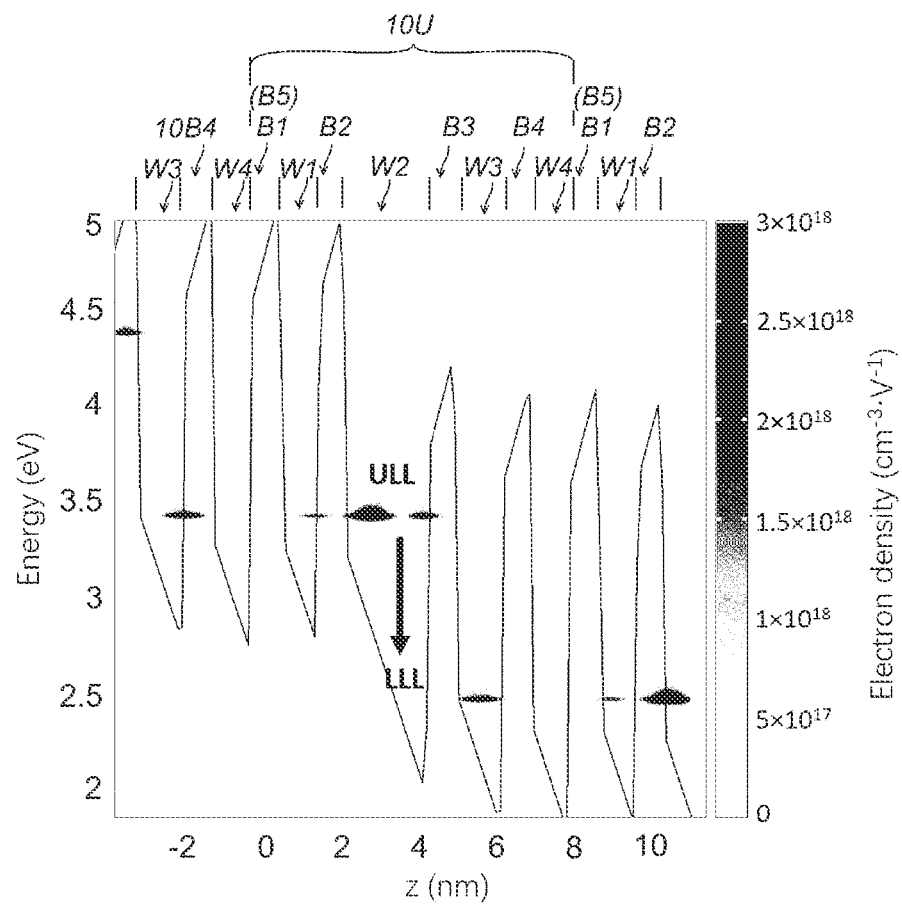
FIG. 4 is a map showing the electron density in the bound state of electrons calculated for the operating state of an example design of a QCL element of the present disclosure, versus energy and position in the thickness direction.
Figure 5:
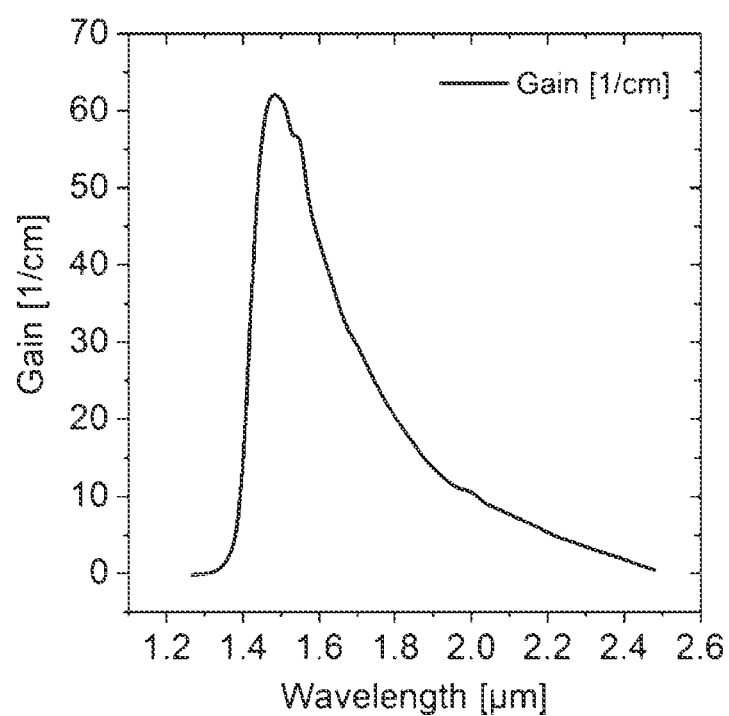
FIG. 5 is a characteristic diagram showing optical gain versus wavelength calculated for an operating state in a certain design example of a QCL element in an embodiment of the present disclosure.
Figure 6:
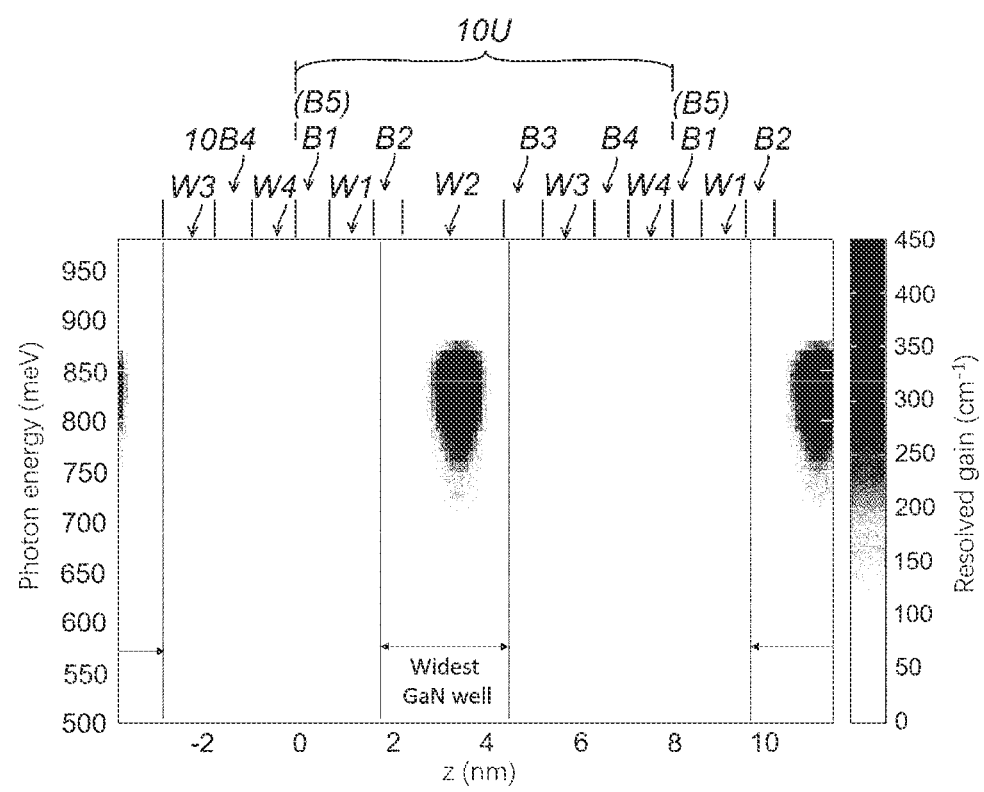
FIG. 6 is a map showing optical gain with respect to photon energy versus position in the thickness direction, calculated for the operating state in one design example of a QCL element in an embodiment of the present disclosure.

FIG. 4 is a map ("electron distribution map") that shows the electron density in the bound state of electrons calculated for the operating state against energy and position in the thickness direction in the design example of the QCL element 1000. It is shown that the population inversion is clearly realized between the upper and lower lasing levels in this design, and the numerical value for this is $5.8 \times 10^{16}$ cm$^{-3}$. FIG. 5 shows the optical gain at an operating temperature of 300K for each wavelength in the example design of the QCL element 1000. As shown in FIG. 5, which is calculated by theoretical calculation, the QCL element 1000 of this embodiment has an optical gain of as high as 63 cm$^{-1}$ at a wavelength of 1.55 μm at 300K. FIG. 6 shows the calculated optical gain (spatial optical gain) shaded at each spatial position in the thickness direction at an operating temperature of 300K. The location where the radiative transition occurs between the upper and lower lasing levels is clearly localized, and it can be confirmed at first glance that it can actually occur in the active region. Since laser oscillation can be realized when the optical gain of about 30 cm$^{-1}$ is obtained, these results show that the lasing is possible at an operating temperature of 300 K.

Figure 7:
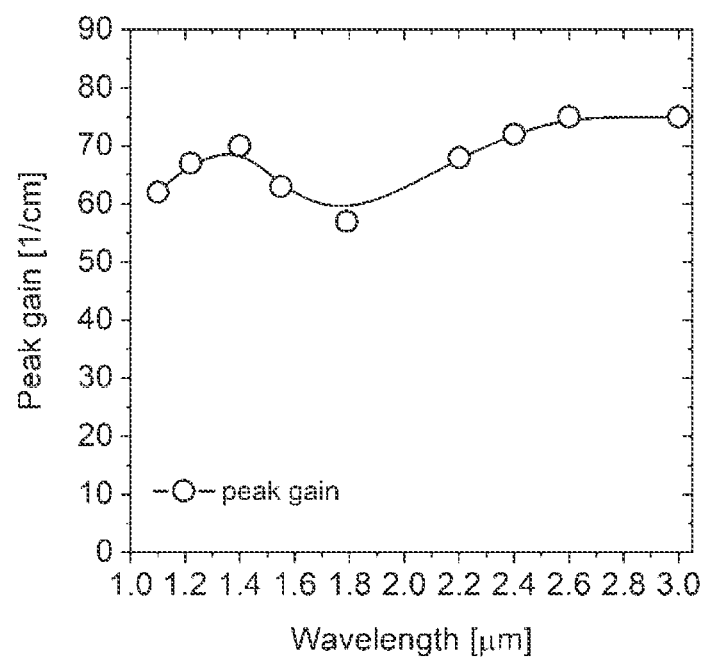
FIG. 7 is a characteristic diagram of peak of optical gain values for a certain design example of a QCL element in an embodiment of the present disclosure, where the design is optimized for each wavelength.

FIG. 7 shows a characteristic diagram of optical gain values for a design of the QCL element in the present embodiment calculated for an operating temperature of 300K where the design is optimized for each wavelength. For a wavelength of 1.55 μm, a high gain was obtained in the specific design example described above, shown in Table 1. Similar to this design example, the QCL element 1000 can be optimized for other wavelengths by adjusting the layer thicknesses and x and y (AlN composition ratios in the mixed crystal) for the well layers 10W1 to W4 and barrier layers 10B1 to 10B5. The optical gain at each wavelength in FIG. 7 was obtained as a result of such optimization. As shown in FIG. 7, the present design demonstrates its applicability in tuning the laser wavelength in the range of 1.1 to 3 μm.

Figure 8:
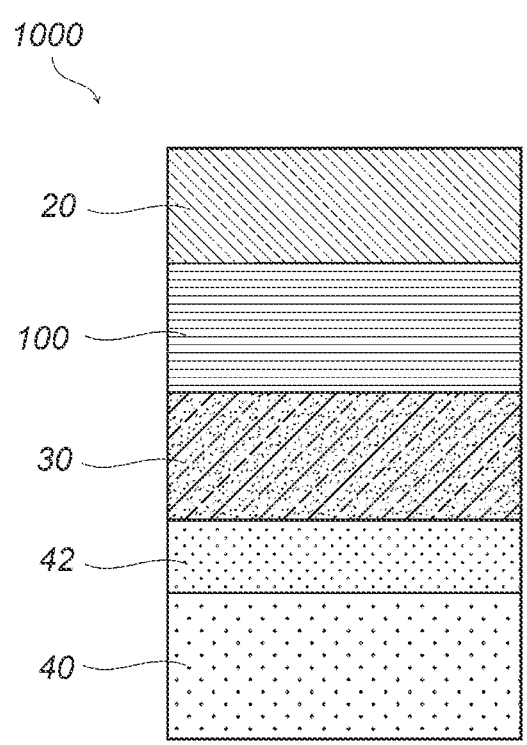
FIG. 8 shows a configuration diagram of the manufacturing method and structure obtained by epitaxial growth of a QCL element in an embodiment of the present disclosure.

FIG. 8 shows a configuration diagram of the manufacturing method and structure of a QCL element 1000 of an embodiment of the present disclosure, which realizes the structure of the specified configuration example shown in Table 1. An AlN layer 42, which serves as a buffer of 1 micron thickness, is formed on a sapphire substrate 40 by the MOCVD (metal organic vapor deposition) method. In succession, an Al0.5Ga0.5N layer of 2 microns thick with a doping level of $5 \times 10^{18}$ cm$^{-3}$ is formed using the AlN layer 42 as a template. Then, the process is moved to the PAMBE (plasma assisted molecular beam epitaxy) method, where a 40 period QCL structure 100 with a total thickness of 400 nm is grown for the active region. The raw materials employed in this process are Ga source and nitrogen gas. In PAMBE process, a reactivity is added to nitrogen by plasma. Finally, it is capped by a 400 nm thick n-type TCO (ZnO, ITO) with a doping level of $5 \times 10^{19}$ cm$^{-3}$ by MOCVD to make a TCO layer for the conductive area 20. This doped TCO layer can not only serve as an index guide structure, but can also be used as an intermediate layer between the metal and the active region for smooth electrical pumping. In the manufacturing process of the QCL element 1000 of this embodiment, it is possible to form the QCL structure 100 by the ammonia MEB method or MOCVD method in addition to the PAMBE method.

Figure 9:
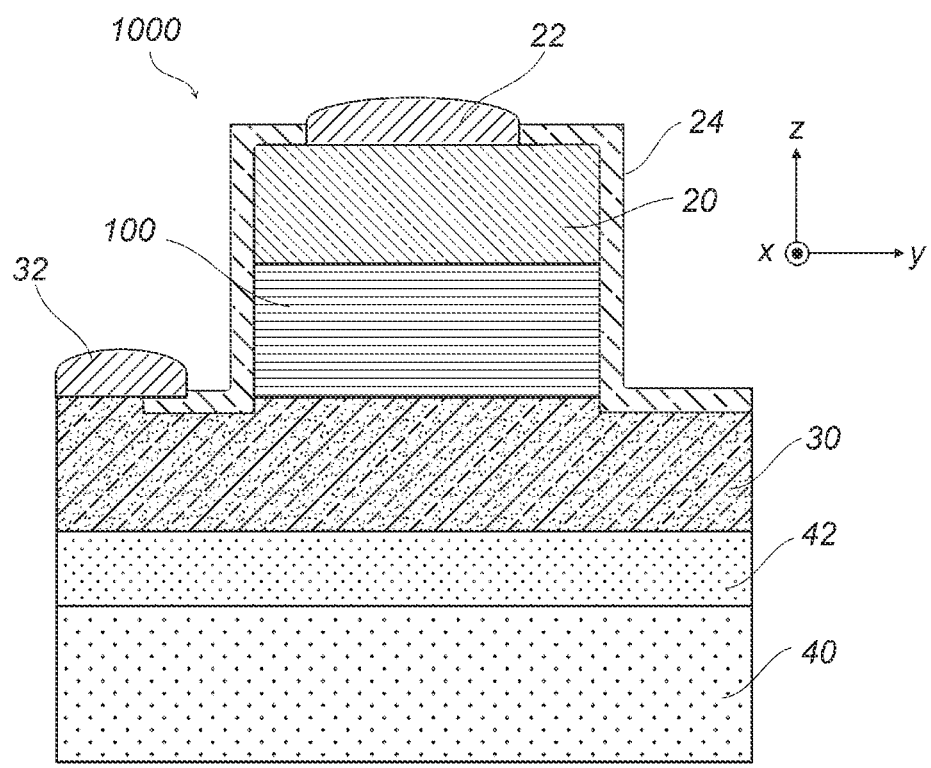
FIG. 9 shows a configuration diagram of a cross-section of the radiation plane of a QCL element in an embodiment of the present disclosure.

FIG. 9 shows a configuration diagram of a cross-section of the emission surface of the QCL element 1000 of the present embodiment. In the mesa structure, also shown in FIG. 2, metal contacts 22 and 32 are formed to make electrical connections to the conductive sections 20 and 30. The metal contacts 22 and 32 are stacked layers with structures of Tl/Al/Ni/Au each. In order to further concentrate the optical field of the emission, the side in the y direction (horizontal in the paper plane of FIG. 9) perpendicular to the emission surface is trimmed. A silicon nitride film (SiNx) is then formed on the trimmed surface as passivation 24. The x-direction end face of the entire device where the stacked cross section of the QCL structure 100 reaches becomes the emission surface. This emission surface contributes to the induced emission by producing a round-trip traveling wave with the help of the return light as it becomes a refractive index step interface and with the help of an external resonator such as a mirror placed as the need arises. The lateral width is typically fabricated to be 5-10 μm, and in-plane confinement is achieved by total reflection guided by refractive index steps in the y direction. The passivation 24 has no particular effect as silicon nitride film has a refractive index of about 2 and is thin.

Figure 10:
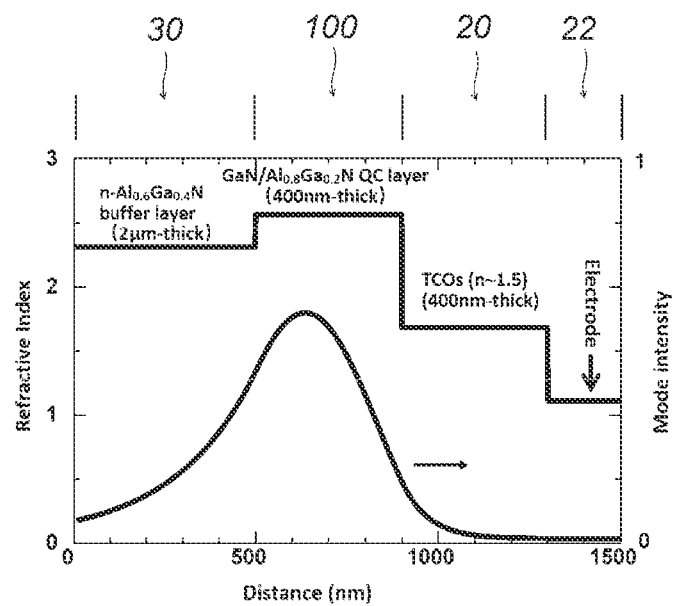
FIG. 10 is a graph showing the index guide structure and the calculated confinement intensity of its optical mode in a certain design example of a QCL element in an embodiment of the present disclosure.

In the thickness direction (z-direction), confinement is achieved by an index guide structure (waveguide structure) with a low refractive index in the conducting parts 30 and 20 combined with a high refractive index in the semiconductor superlattice QCL structure 100. FIG. 10 is a graph showing the index guide waveguide structure and the calculated intensity of confinement of its optical modes in the QCL device of the present disclosure for a wavelength of 1.55 μm. The horizontal axis is in the direction of the layer thickness, and the origin is set at a position 500 nm below the top, in the middle of the conductive section 30 (Al$_z$Ga$_{1-z}$N layer) in FIG. 2. The refractive index at a wavelength of 1.55 μm is about 2.2 for the conductive section 30, which is an Al$_z$Ga$_{1-z}$N layer, and about 1.7 for the TCO layer used for the conductive section 20, which is, for example, ITO or ZnO. In contrast, the refractive index of the QCL structure 100 is about 2.5 at the same wavelength. Therefore, the conductive part 30 and the conductive part 20 in the QCL structure 100 have sufficient light confinement effect for the QCL structure 100 sandwiched between them. It should be noted that the conductive section 20 is an n-type doped TCO layer, which exhibits good electrical properties and its electrical contact properties are also ohmic.

As described above, the QCL element 1000 in the present embodiment achieves lasing operation with high efficiency in the near-infrared wavelength range.

2. Variations

Various variations can be made in this embodiment. For example, in the QCL structure 100 that serves as the active region, the materials of the well layer and barrier layer of each unit structure can be changed in various ways according to the operating temperature and emission wavelength. For example, in terms of the composition Al$_x$Ga$_{1-x}$N the well layer and Al$_y$Ga$_{1-y}$N of the barrier layer, increasing the ratio of AlN in the barrier layer sufficiently higher than in the well layer, that is, increasing the value of y-x, results in a higher barrier layer with a GaN/AlGaN based composition. Therefore, it is not necessary for the well layer to be made of GaN.

In the above description, the embodiment of the present disclosure has been described specifically. Any description in this Specification is for the purpose of explaining the present disclosure, therefore the scope of the invention of this disclosure should be determined based on recitations of the claims. Furthermore, other variation based on any combination of the embodiment is included in the present disclosure, which variation should be also within a scope of the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

REFERENCE SIGNS LIST

1000 QCL element
100 QCL structure (semiconductor superlattice structure)
10B, 10B1~10B5 barrier layer
10W, 10W1~10W4 well layer
10U unit structure
20 conductive section (TCO layer)
22, 32 metal contact
24 passivation film
30 conductive section ($Al_zGa_{1-z}N$ layer)
40 sapphire substrate
42 AlN layer
2000 electromagnetic wave
ULL upper lasing level
LLL lower lasing level

The invention claimed is:

1. A quantum cascade laser element comprising:
a semiconductor superlattice structure sandwiched between a pair of conductive sections, wherein,
the semiconductor superlattice structure is an active region that emits electromagnetic waves of a certain wavelength in the near-infrared range under an external voltage applied through the pair of conductive sections during operation,
the active region has a plurality of unit structures that are stacked, one on top of the other,
each unit structure includes four well layers of a composition of AlxGa1-xN separated from each other by a barrier layer of a composition of AlyGa1-yN with $0 \leq x < y \leq 1$, with one of the well layers being a maximum thickness well layer that is thicker than the others, and
both of the conductive sections in the pair of conductive sections have a refractive index lower than a refractive index of the active region for electromagnetic waves of the wavelength.

2. The quantum cascade laser element according to claim 1,
wherein the composition of the four well layers is GaN, and the composition of the barrier layer is Al0.8Ga0.2N.

3. The quantum cascade laser element according to claim 2,
wherein one of the pair of conductive sections is formed on an AlN layer on a sapphire substrate and is made of an AlzGa1-zN ($0.4 \leq z \leq 0.6$) layer doped so that its conductive type is n-type.

4. The quantum cascade laser element according to claim 3,
wherein the other of the pair of conductive sections is an oxide conductor doped so that its conductive type is n-type.

5. The quantum cascade laser element according to claim 1,
wherein thicknesses of well layers sandwiched between two maximum thickness well layers that are in two consecutive unit structures are progressively increasing or decreasing in accordance with their stacking order.

6. The quantum cascade laser element according to claim 1,
wherein the maximum thickness well layer has a thickness such that the maximum thickness well layer accommodates only two confinement levels in thickness direction under the external voltage.

7. The quantum cascade laser element according to claim 6,
wherein the two confinement levels in thickness direction under the external voltage are a lower lasing level and an upper lasing level that are separated by an energy difference corresponding to the wavelength.

8. The quantum cascade laser element according to claim 7,
wherein, under the external voltage, a confinement level in thickness direction of any of three well layers that are consecutively located upstream of the maximum thickness well layer in terms of electron stream serves as an injection level for injecting electrons to the upper lasing level of the maximum thickness well layer by phonon-electron scattering mediation.

9. The quantum cascade laser element according to claim 8,
wherein the injection level is a ground state of a well layer that is upstream nearest neighbor of the maximum thickness well layer in terms of the electron stream.

10. The quantum cascade laser element according to claim 7,
wherein, under the external voltage, a confinement level in thickness direction of any of three well layers that are consecutively located downstream of the maximum thickness well layer in terms of electron stream serves an extraction level that extracts electrons from the lower lasing level by sequential resonant tunneling.

11. The quantum cascade laser element according to claim 10,
wherein, under the external voltage, a plurality of confinement levels in thickness direction of three well layers that are consecutively located downstream of the maximum thickness well layer in terms of the electron stream operate to extract electrons from the lower lasing level by resonant tunneling and transport the electrons immediately.

12. The quantum cascade laser element according to claim 1,
wherein the electromagnetic wave is an electromagnetic wave of any wavelength between 1.1 μm and 3 μm.

* * * * *